United States Patent [19]
Hegendorfer

[11] 3,766,407
[45] Oct. 16, 1973

[54] ARRANGEMENT FOR APPLYING A SIGNAL TO A SELECTED LINE

[75] Inventor: Max Hegendorfer, Forchheim, Germany

[73] Assignee: Grundig E.M.V. Elektro-Mechanische Versuchsanstalt Max Grundig, Furth, Germany

[22] Filed: Mar. 8, 1972

[21] Appl. No.: 232,869

[30] Foreign Application Priority Data
Mar. 26, 1971 Germany.................. P 21 14 633.8

[52] U.S. Cl....................... 307/223, 328/48, 334/15
[51] Int. Cl......................... H03k 21/00, H03k 5/00
[58] Field of Search....................... 307/223; 334/15; 325/335, 469, 470; 328/48

[56] References Cited
UNITED STATES PATENTS

| | | | |
|---|---|---|---|
| 3,345,569 | 10/1967 | Casterline et al. | 307/223 R |
| 3,596,183 | 7/1971 | Spies | 334/15 X |
| 3,602,822 | 8/1971 | Evans et al. | 325/470 X |

*Primary Examiner*—John Zazworsky
*Attorney*—Michael S. Striker

[57] ABSTRACT

An arrangement for applying a signal to one of a plurality of lines has a series of contact switches. Actuation of any one of the switches causes a pulse sequence to be applied to one of a plurality of input lines. The pulse sequence is also applied to a counter which counts until the counter output corresponds to the energized input line. The binary counter output is converted to decimal form and the decimal output energizes an output line corresponding to the energized input line.

16 Claims, 2 Drawing Figures

ARRANGEMENT FOR APPLYING A SIGNAL TO A SELECTED LINE

BACKGROUND OF THE INVENTION

This invention relates to electronic control circuits, and in particular an arrangement for selectively applying one of a plurality of control signals to a circuit.

Selective application of voltages has been useful in relation to arrangements which permits the resonant frequency of an electrical oscillatory circuit to be selectively changed by means of switching diodes controlled by switch voltages and/or by means of capacitance diodes of which the capacitance may be varied by selectively switched preadjusted tuning potentials.

Circuit arrangements of this kind are known, for example, in television receivers in which the selection of the preadjusted tuning potentials, to receive different television channels, for example, is effected by motor-driven mechanical switches, by electro-mechanical relays or by means of push-button switches appropriate to the respective preadjusted tuning potentials. These arrangements have the disadvantage in that they involve mechanically moving parts, which are very liable to defect and always involve friction. Push-button switches have the further disadvantage that they are unsuitable for remote control operation.

The problem, to the solution of which the invention is directed, is to make possible the selection of the switching voltages for switching diodes and/or of preadjusted tuning potentials for a capacitance diode, as well as making possible the application of similar control voltages to other circuits requiring the same, without the use of mechanically moving parts, other than simple buttons as the actuating elements, so that this selection may also be remote controlled.

Also, the known apparatus has an additional disadvantage. Thus, when a plurality of voltages are provided and one of these voltages is to be selected, this has usually involved stepping through each of the series of steps until the desired voltage is obtained. Thus, in connection with such circuits utilized in the television receivers for modifying the resonant frequency of an oscillatory circuit, when one channel is desired to be received, it has been required to switch through all the intermediate channels until the desired channel is selected. This has been an inconvenience as well as being more time consuming. Also, wear on the component parts has been greater because of the increased switching which has been required. Because such voltage stepping circuits are utilized not only in television receivers, but also in commercial transmitters, measuring apparatus and test instrumentation, as well as other electronic circuitry and control systems, it has been important to develop an arrangement for selectively applying on of a plurality of control signals to a circuit, without mechanical by moving parts, and without the necessity of switching through each of the possible positions in a series before attaining the desired position.

SUMMARY OF THE INVENTION

Accordingly, it is an object of the present invention to provide an arrangement for selectively applying one of a plurality of control signals to a circuit which does not have the disadvantages known in the prior art.

It is another object of the present invention to provide an arrangement for selectively applying one of a plurality of control signals to a circuit which is simple in construction and economical to manufacture and which does not utilize mechanically moving parts.

It is still another object of the present invention to provide an arrangement for selectively applying one of a plurality of control signals to a circuit which utilizes integrated circuitry, to thereby minimize the amount of effort required to construct the same.

It is a further object of the present invention to provide an arrangement for selectively applying one of a plurality of control signals to a circuit which, upon actuation of one of a series of switches, automatically steps an electronic switch until the desired control voltages is achieved and stops immediately thereafter even if the switch is actuated thereafter.

It is still a further object of the present invention an arrangement for selectively applying one of a plurality of control signals to a circuit which can automatically provide the desired control voltage upon the actuation of a corresponding switch and which can also be remotely controlled, the latter being effective to step the control voltages from one control voltage to the next in the series.

According to the present invention, an arrangement for selectively applying one of a plurality of control signals to a circuit is provided, such an arrangement comprising a plurality of pulse generator means actuatable to generate pulses. Counter means are provided for counting said pulses each different count in said counter means being representative of a different one of said generator means. Circuit means are provided which are connected to said generator means and to said counter means for transmitting the pulses from the actuator generator means to the latter. Comparator means are provided having a plurality of inputs each connected to a different one of each pulse generator means, said comparator means being further connected to said circuit means and to said counter means to terminate the transmission of pulses to the latter upon detected correspondence between the count in said counter means in the actuated pulse generator means. Also, converter means are provided having a plurality of outputs, one for each of said pulse generator means, said converter means being connected to said counter means for detecting the count and for generating a control signal at that output which is associated with the actuated generator means.

More particularly, according to a presently preferred embodiment of the invention, contact switches are mounted on an enclosure which can easily be actuated from outside the enclosure, the contact switches being effective to generate a series of pulses at the line frequency to a pulse counter. The counter is of the binary type, and the output thereof is a binary signal representing the count in the counter. Also, said circuit means comprises a NAND-gate having a number of inputs equal to said plurality of comparator means inputs each of the inputs of the former being connected to a corresponding one of the inputs of the latter, said NAND-gate having an output. An inverting amplifier means is connected between said output and said comparator means. Said comparator means has a STROBE-input and an output, and wherein said NAND-gate output is connected to said STROBE-input, and the output of said comparator means is connected to said binary counter.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1:
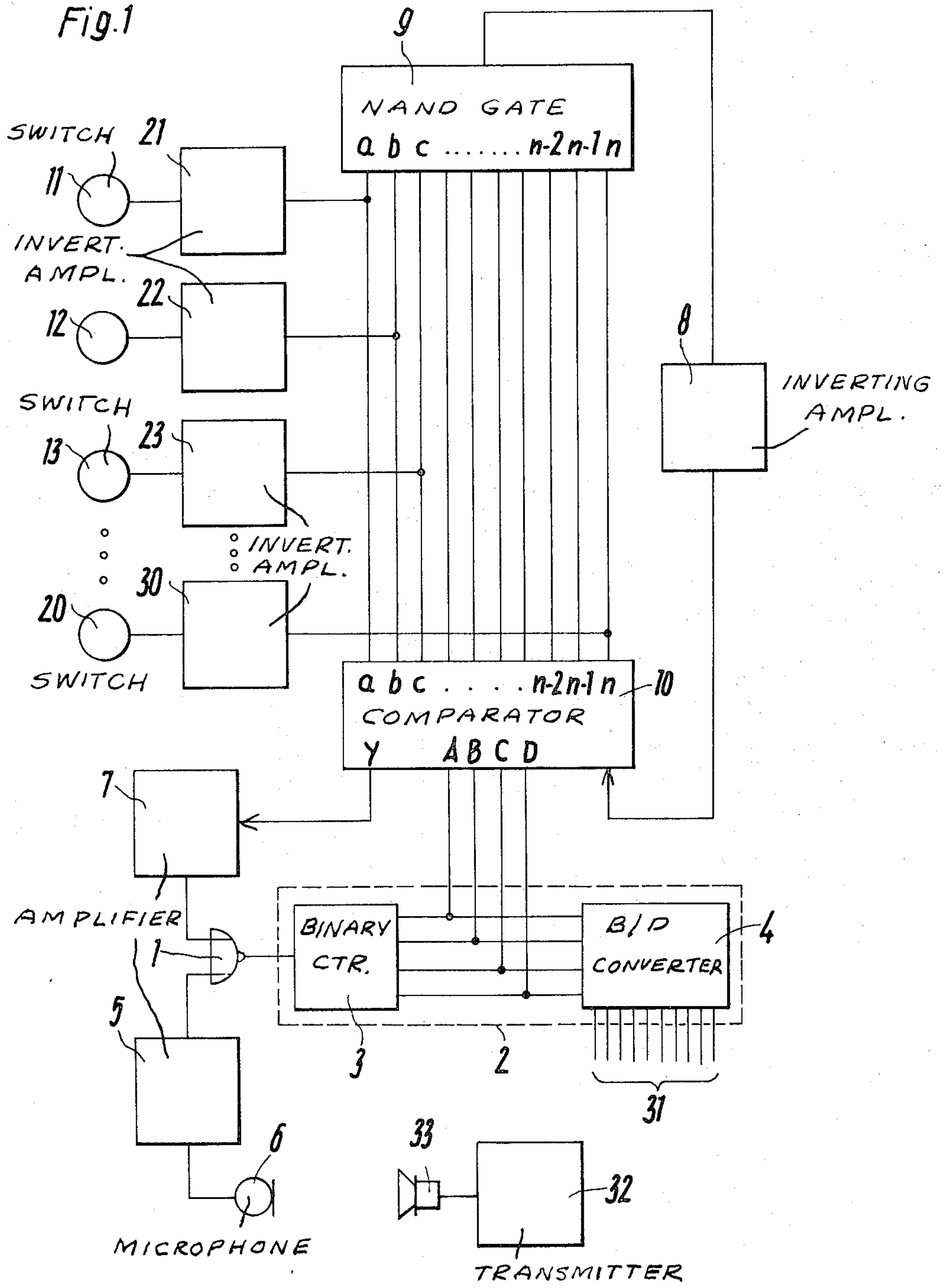
FIG. 1 is a circuit diagram, partly in schematic, of an arrangement for selectively applying one of a plurality of control signals to a circuit in accordance with the present invention.

The invention will be described, by way of example only, in connection with a television receiver. Referring now to FIG. 1, the output of a NOR-gate 1 is connected to an electronic stepping switch 2 which consists of a binary counter 3 and a binary decimal converter 4. The operation of the electronic stepping switch 2 will be described in further detail hereafter.

The NOR-gate 1 has two inputs, one of which is connected to an amplifier 5 which is connected to a microphone 6. These two latter components form part of a remote control means which will be described hereafter. The other input of the NOR-gate is connected to an amplifier 7.

An inverting amplifier 8 is connected between a NAND-gate 9 and a comparator 10. The comparator 10 has a plurality of inputs generally designated by the letter references *a*, *b*, *c*, . . . , $n-1$, *n*. In the particular embodiment shown, *n* is equal to 10. Similarly, NAND-gate 9 has a corresponding set of inputs, likewise designated by the same reference designations. Thus, the a input of the NAND-gate 9 is connected to the a input of the comparator 10, the b input of the NAND-gate 9 is connected to the b input of the comparator 10, and so on. With ten such inputs provided, each of the corresponding pair of inputs can represent a different decimal number, e.g. 0 to 9.

A series of insulatedly mounted plates or contact switches 11–20, which may be selectively touched by a finger of a person operating the receiver, are connected to a corresponding set of inverting amplifiers 21–30. The output of the amplifier 21 is connected to the a inputs of the NAND-gate 9 and the comparator 10, the output of the inverting amplifier 22 is connected to the b inputs of the NAND-gate 9 and the compartor 10, and so on. In this manner, each of the contact switches and inverting amplifiers are connected to a different one of the pairs of connected inputs of the NAND-gate 9 and the comparator 10.

The comparator 10 is provided with binary inputs A,B, C and D. The output of the binary counter 3 has four leads, as shown, which are connected to the binary inputs of the comparator 10. The comparator 10 is also provided with a STROBE-input which is connected to the output of the inverting amplifier 8 and a Y output which is connected to the input of the amplifier 7.

The binary-to-decimal converter 4 is provided with four binary inputs which are connected to the binary outputs of the binary counter 3 and the converter 4 has ten outputs generally designated by the reference numeral 31. The outputs 31 of the binary-to-decimal converter 4 are arranged to duplicate the arrangement of the contact switches 11–20, so that when the contact switches are actuated in the sequence in which they are arranged, control voltages will be generated in the same sequence at the outputs 31, in a manner to be described. Although the present embodiment contemplates the connection of the outputs 31 to a television receiver oscillating circuit, it will become clear from the description of the invention that follows, that the present application can have many other uses outside of the television art.

The remote control means further includes a transmitter 32 and an ultrasonic radiator 33, the operation of which are well known.

Figure 2:
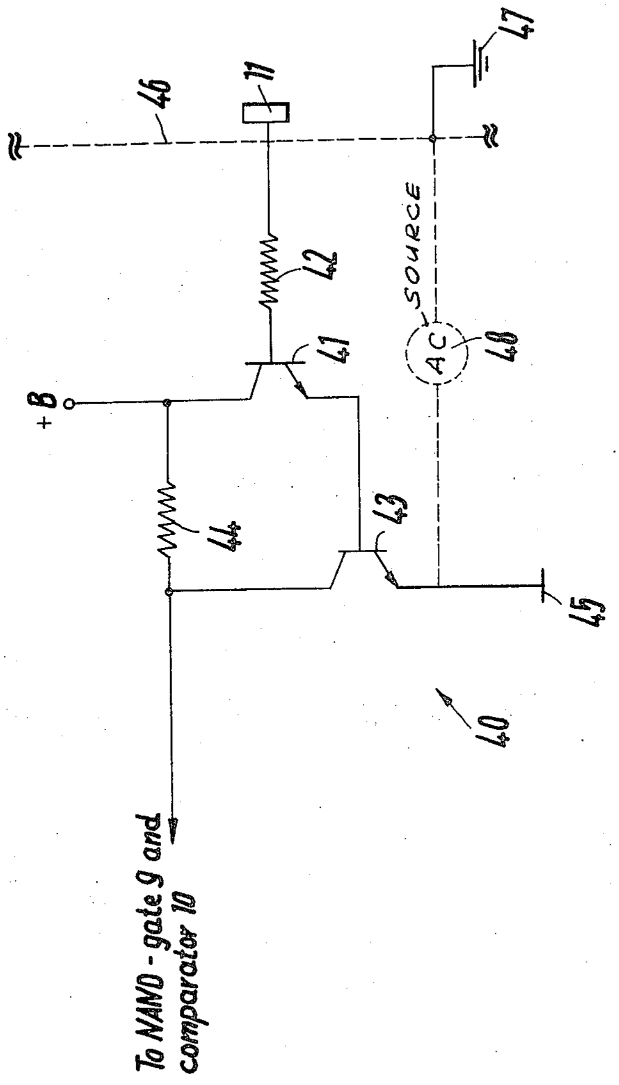
FIG. 2 is a partial circuit diagram, partly in schematic, of the circuit shown in FIG. 1 and shows one of the pulse generating means.

Each of the connected contact switches and inverting amplifiers constitutes a pulse generator means which is actuatable to generate pulses. In accordance with the presently preferred embodiment, the line voltage having a line frequency is utilized for the generation of the pulses upon actuation of one of the contact switches. One possible embodiment of such pulse generating means is shown in FIG. 2. Here, the contact switch 11 is shown to be connected to an inverting amplifier generally shown by the reference numeral 40, each inverting amplifier 21–30 being similarly configurated. The inverting amplifier consists of a transistor 41 whose base is connected to the contact switch 11 through a resistor 42. A second transistor 43 has its base connected to the emitter of the transistor 41, while the collectors of the two transistors 41 and 43 are connected by means of a resistor 44. The collector of the transistor 41 is connected to the positive pole +B of a source of D.C. voltage (not shown), while the collector of the transistor 43 is connected to the NAND-gate 9 input A as well as the A input of the comparator 10.

The emitter of the transistor 43 is connected to a chassis ground 45. The chassis ground 45, in the presently preferred embodiment, is not the same as the overall circuit ground, here the latter existing at the conductive surface 46 and generally represented by the reference numeral 47.

The contact switch 11 is movable between a normally extended position, as shown in FIG. 2, and a depressed position, wherein the contact switch 11 moves towards the left, as viewed in FIG. 2, until the contact 11 touches the conductive surface 46 which is connected to the circuit ground 47.

In the presently preferred embodiment, the chassis ground 45 and the circuit ground 47 are not of the same potential, and an alternating potential is provided between these two grounds. The source of voltage existing between the two grounds is generally designated by the alternating current source 48, shown schematically by the dashed outline.

With the circuit as above described, when the contact switch 11 is in its extended position, the base of the transistor 41 is floating since the contact switch is not making contact with the conductive surface 46. With no input signal applied between the base of the transistor 41 and the emitter of the transistor 43, there is no signal at the collector of the transistor 43 and it remains at substantially the +B voltage since the transistor 43 is essentially non-conductive.

Now, for example, when the contact switch 11 is touched the contact switch 11 makes contact with the conductive surface 46 to thereby bring the potential of the base of the transistor 41 to that of the circuit ground 47. However, since the emitter of the transistor 43 remains at the chassis ground 45, the voltage of the alternating current source 48 is now applied between the base of the transistor 41 and the emitter of the transistor 43. The amplitude of the voltage supplied by the alternating current source 48 is selected to be large enough to overdrive the transistors during the positive half cycles, the transistors remaining in the blocked conditions during the other half of the cycles. The overdriving of the transistors during one-half of the cycle causes clipping by virtue of saturation of the transistors, the resulting output of the collector 43 being a series of rectangular pulses which are utilized as to be described. By selecting a value of the resistor 42 to prevent damage to the transistors 41 and 43, the amplitude of the voltage of the alternating current source 48 according to the presently preferred embodiment is in the order of 150 volts $V_p$. This is conveniently selected to be equal to the line voltage available for operating the receiver, the presently preferred embodiment utilizing a line frequency of 50 HZ. However, as it will become clear, the actual amplitude of the applied voltage or the exact frequency thereof are not critical for purposes of the present invention. It is only necessary that the voltage be sufficient to saturate the transistors during one-half of the cycle and cut-off the transistor during the other so that a series of rectangular pulses is generated. The frequency of the line voltage is likewise not critical. It is preferable, however, that the line frequency be sufficiently high so that during the minimum contemplated time for depressing the contact switch 11, a number of pulses will be generated at the collector of transistor 43 which is at least equal to the number fo channels or pulse generator means to be used.

The operation of the arrangement will now be described. If none of the contact switches 11–20 is touched, it can be seen from FIG. 2, that the output of the inverting amplifiers 21–30 will be maintained at the logical 1 (some +5V) at all the inputs of the NAND-9 and of the comparator 10. With logical 1 levels on all the inputs to the NAND-gate 9, a logical 0 thus results at the output of the NAND-gate 9 and the logical 1 is applied by way of the inverting amplifier 8 to the STROBE-input of the comparator 10. Data comparison in the comparator 10 is thus inhibited and the output Y of the comparator 10 yields a 0 output. A 0 level applied to the amplifier 7 results in a 0 output at the output thereof. Assuming, for the moment, that the output of the amplifier 5 is also at the level 0 level, the output of the NOR-gate 1 is at the logical 1 level. In this condition, the count of the counter 3 does not change. Whatever binary count exists at the output of the binary counter 3 is converted by the binary decimal converter 4 to a respective decimal output so that a control sighal is provided at that output 31 which corresponds to the binary count.

Also, with the output of the amplifier 7 at the logical 0 level, the binary counter 3 is receptive to pulses from the remote control arrangement 5, 6, 32 and 33 by way of the NOR-gate 1. For example, by actuating the ultrasonic transmitter 32, in a well-known manner, the output of the amplifier 5 is momentarily changed from the normal 0 level to the 1 level. This causes a similarly instantaneous change of levels at the output of the NOR-gate 1 and said outputs momentarily changes from the normal 1 level to the 0 level. According to the presently preferred embodiment, the binary counter 3 is arranged to change the count on each transition from the normally high to the 0 level. Thus, it is seen that each actuation of the ultrasonic transmitter 32 causes the binary counter 3 to increase its count by one. This changed count being correspondingly translated by the binary-to-decimal converter 4 to a decimal equivalent to thereby provide a control voltage at a different one of the output 31. In the remote control mode of operation, the stepping of the electronic stepping switch 2 or the movement of the control voltages from one of the outputs 31 to the next to the series is sequential, each actuation of the ultrasonic transmitter 32 causing the movement of the control voltage to the next successive output of the series of outputs 31.

As soon as one of the contact switches 11–20 is touched, a series of pulses is generated at the output of the respective inverting amplifier (21–30) connected to the actuated switch. As described above, a voltage wave form at the outputs of the inverting amplifiers generally comprises square wave pulses, the latter representing both the 0 and 1 levels during different portions of the cycle.

The operation of the arrangement will further be described by assuming that the contact switch 11 is actuated. When this is done, the output of the inverting amplifier 21 will periodically change from the normal 1 level to the 0 level, as described above. Each time that the output of the inverting amplifier 21 goes to the 0 level, the output of the NAND-gate 9 moves from the normal 0 level to the 1 level. The inverting amplifier 8 inverts the signal existing at the output of the NAND-gate 9, so that the excursions at the STROBE-input change periodically from the normally high 1 level to the 0 level. Thus, the output of the NAND-gate 9 goes to 1 in synchronism with the main line frequency, the latter frequency being comparable to the clock frequency for this particular system. Each time that the STROBE-input is taken to the 0 level, the Y output of the comparator 10 changes from the normal 0 level to the 1 level. The latter excursions are reflected by way of the amplifier 7 to the NOR-gate 1, which causes the output of said gate to periodically drop to the 0 level. As described above, such an effect causes the counter 3 to be stepped to the next count, this likewise taking place in synchronism with the main line frequency until the numerical setting of the counter 3 corresponds with that of the decimal number appropriate to the contact switch which has been touched.

Through the connection of the binary outputs of the counter 3 with the binary inputs A, B, C, and D of the comparator 10, a comparison is effected between the decimal number appropriate to the contact switch which has been touched and the binary number given by the instantaneous setting of the counter 3, the Y output of the comparator going to 0 when these numbers match, so that the pulse counter 3 receives no further pulses. The switching process is then ended until another one of the contact switches 11–20 is touched, or until pulses are applied to the input of the counter 3 by means of the remote control, as described above.

It will be understood that each of the elements described above, or two or more together may also find a useful application in other types of control circuits differing from the types described above.

While the invention has been illustrated and described as embodied in arrangement for selectively applying one of a plurality of control signals to a circuit, it is not intended to be limited to the details shown, since various modifications and structural changes may be made without departing in any way from the spirit of the present invention.

Without further analyses, the foregoing will so fully reveal the gist of the present invention and others can be applying current knowledge readily adapt if for various applications without omitting features that, from the standpoint of prior art, fairly constitute essential characteristics of the generic or specific aspects of this invention and, therefore such adaptations should and are intended to be comprehended within the meaning and range of equivalence of the following claims.

What is cliamed as new and desired to be protected by Letters Patent is set forth in the appended.

I claim:

1. Arrangement for selectively applying a control signal to one of a plurality of output lines, comprising, in combination, electronic step switch means having a step switch input and a plurality of step switch outputs, each connected to one of said output lines, for furnishing said control signal in sequence on said output lines in response to signals applied to said step switch input; a plurality of input lines each corresponding to one of said output lines; a plurality of pulse generator means each having an output connected to a corresponding one of said input lines, for furnishing a pulse sequence to said corresponding one of said input lines upon external activation, whereby external activation of one of said pulse generator means creates an energized input line; and circuit means connecting said input lines to said step switch input in such a manner that said sequence of pulses is applied to said step switch input until said step switch output furnishes said control signal to the one of said output lines corresponding to said energized input lines.

2. An arrangement as defined in claim 1, wherein each pulse generator means comprises, alternating current source means, amplifier means; and switch means for applying the alternating current from said source means to said amplifier means.

3. An arrangement as defined in claim 2, wherein said switch means comprise a contact switch actuable by touching the latter.

4. An arrangement as defined in claim 3, wherein said alternating current source means comprises a line voltage having a predetermined line frequency.

5. An arrangement as defined in claim 4, wherein said arrangement housed in an enclosure, said contact switch, being mounted for permitting actuation of the latter from outside said enclosure.

6. An arrangement as defined in claim 4, wherein said line frequency is 50 Hz.

7. An arrangement as defined in claim 5, further comprising remote control means connected to said binary counter for transmitting pulses to the latter and changing the count at the output thereof.

8. An arrangement as defined in claim 7, wherein said amplifier means comprises an inverting amplifier.

9. An arrangement as defined in claim 1, further comprising a chassis, said pulse generator means being connected to said chassis, said pulse generator means comprising input means for actuating said generator means in response to application of an alternating current thereto; source means provided between said chassis and the circuit ground for providing an alternating current and switch means for applying the alternating current to said input means by connecting the latter to the circuit ground in response the closing the switch.

10. An arrangement as defined in claim 1, wherein said pulse generator means comprises source means for supplying an alternating current; transistor means having emitter means connected to one terminal of said source means, base means connectable to the other terminal of said source means in response to actuation of said pulse generator means.

11. An arrangement as set forth in claim 1, wherein said step switch means comprises a binary counter, and binary-decimal converter means connected to the output of said binary counter.

12. An arrangement as set forth in claim 11, wherein said circuit means comprise comparator means having a plurality of first inputs, each connected to a corresponding one of said input lines, a plurality of binary inputs connected to said output of said binary counter, a strobe input, and a comparator output connected to the input of said binary counter, for furnishing a pulse to said binary counter in response to a pulse at said strobe input until the signals at said binary output signify said selected input line.

13. An arrangement as set forth in claim 12, wherein said circuit means further comprise a NAND-gate having a plurality of NAND-gate inputs each connected to one of said input lines, and a NAND-gate output connected to said strobe input of said comparator means.

14. An arrangement as set forth in claim 13; further comprising receiver means for receiving remote control signals; and NOR-gate means having a first input connected to said comparator output, a second input connected to said receiver means and a NOR-gate output connected to the input of said binary counter.

15. An arrangement as set forth in claim 14; further comprising an amplifier connected between said comparator output and said first input of said NOR-gate means.

16. An arrangement as set forth in claim 1, wherein said arrangement is a station selector arrangement for communications equipment.

* * * * *